(12) United States Patent
Lombard et al.

(10) Patent No.: US 9,841,266 B2
(45) Date of Patent: Dec. 12, 2017

(54) APPARATUS AND METHOD FOR MAGNETIC SENSOR BASED SURFACE SHAPE ANALYSIS SPATIAL POSITIONING IN A UNIFORM MAGNETIC FIELD

(71) Applicant: Crocus Technology Inc., Santa Clara, CA (US)

(72) Inventors: Lucien Lombard, Grenoble (FR); Bertrand F. Cambou, Flagstaff, AZ (US); Ken Mackay, Le Sappey en Chartreuse (FR)

(73) Assignee: Crocus Technology Inc., Snata Clara, CA (US)

( * ) Notice: Subject to any disclaimer, the term of this patent is extended or adjusted under 35 U.S.C. 154(b) by 0 days.

(21) Appl. No.: 14/863,121

(22) Filed: Sep. 23, 2015

(65) Prior Publication Data
US 2016/0097630 A1  Apr. 7, 2016

Related U.S. Application Data

(60) Provisional application No. 62/059,138, filed on Oct. 2, 2014.

(51) Int. Cl.
| | |
|---|---|
| *G01B 7/14* | (2006.01) |
| *G01R 33/02* | (2006.01) |
| *G01B 7/24* | (2006.01) |
| *G01B 7/28* | (2006.01) |
| *G01B 7/00* | (2006.01) |

(52) U.S. Cl.
CPC ................. *G01B 7/24* (2013.01); *G01B 7/28* (2013.01); *G01B 7/003* (2013.01); *G01R 33/02* (2013.01)

(58) Field of Classification Search
CPC ........ G01R 15/20; G01R 15/18; G01R 33/02; G01D 5/145; G01B 7/003; G01B 7/24; G01B 7/28
USPC ............................................ 324/207.11, 244
See application file for complete search history.

(56) References Cited

U.S. PATENT DOCUMENTS

| | | | |
|---|---|---|---|
| 7,701,202 B2* | 4/2010 | Torres-Jara | G01L 5/16 324/207.2 |
| 8,079,925 B2* | 12/2011 | Englert | A63B 24/0021 473/569 |

(Continued)

OTHER PUBLICATIONS

International Search Report and Written Opinion issued to international patent application No. PCT/US2015/051560, dated Dec. 8, 2015, 7 pgs.

*Primary Examiner* — Reena Aurora
(74) *Attorney, Agent, or Firm* — Cooley LLP

(57) ABSTRACT

A device has a flexible substrate supporting an array of magnetic sensors exposed to a uniform external magnetic field. One or more controllers receive magnetic sensor signals from the magnetic sensors. The one or more controllers collect reference magnetic sensor signals when the flexible substrate is aligned with the uniform external magnetic field. The one or more controllers collect first polarity magnetic sensor signals in response to deformation of the flexible substrate in a first direction. The one or more controllers collect second polarity magnetic sensor signals in response to deformation of the flexible substrate in a second direction. The magnetic sensor signals establish a profile of the orientation of the flexible substrate with respect to the uniform external magnetic field.

5 Claims, 3 Drawing Sheets

(56) References Cited

U.S. PATENT DOCUMENTS

| | | | |
|---|---|---|---|
| 8,547,197 B2* | 10/2013 | Byun | H01C 10/10 338/114 |
| 2003/0151406 A1 | 8/2003 | Wan et al. | |
| 2005/0284221 A1 | 12/2005 | Danisch et al. | |
| 2007/0205766 A1* | 9/2007 | Kou | B82Y 25/00 324/252 |
| 2008/0295611 A1 | 12/2008 | Kisker | |
| 2010/0099951 A1 | 4/2010 | Laby et al. | |
| 2012/0154288 A1 | 6/2012 | Walker | |

* cited by examiner ified in accordance with an embodiment of the invention.

APPARATUS AND METHOD FOR MAGNETIC SENSOR BASED SURFACE SHAPE ANALYSIS SPATIAL POSITIONING IN A UNIFORM MAGNETIC FIELD

CROSS-REFERENCE TO RELATED APPLICATION

This application claims priority to U.S. Provisional Patent Application Ser. No. 62/059,138, filed Oct. 2, 2014, the contents of which are incorporated herein by reference.

FIELD OF THE INVENTION

This invention relates generally to analyzing surface shape and spatial positioning. More particularly, this invention relates to techniques for magnetic sensor based surface shape analysis.

BACKGROUND OF THE INVENTION

Sensors play a crucial role in modern technology as they have become an essential part of millions of products used every day. Sensors can be found in every imaginable type of product from consumer and industrial products, to communications, automotive, and biomedical products. The same is true for magnetic sensors that are used widely in consumer, communications, computer, industrial, automotive, biomedical and precision instrumentation products.

A variety of sensor devices have been used for surface position and shape sensing including optical sensors and stress sensors, such as piezoresistive sensors and piezoelectric sensors. These solutions experience system complexity, high cost and poor performance. Accordingly, it would be desirable to provide new techniques for surface position and shape sensing.

SUMMARY OF THE INVENTION

A device has a flexible substrate supporting an array of magnetic sensors exposed to a uniform external magnetic field. One or more controllers receive magnetic sensor signals from the magnetic sensors. The one or more controllers collect reference magnetic sensor signals when the flexible substrate is aligned with the uniform external magnetic field. The one or more controllers collect first polarity magnetic sensor signals in response to deformation of the flexible substrate in a first direction. The one or more controllers collect second polarity magnetic sensor signals in response to deformation of the flexible substrate in a second direction. The magnetic sensor signals establish a profile of the orientation of the flexible substrate with respect to the uniform external magnetic field.

The disclosed techniques may be combined with other shape sensing methods. The disclosed techniques may be used for rotation sensing and may be applied to three dimensional objects. The earth's magnetic field may be supplemented by a fixed externally generated magnetic field.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
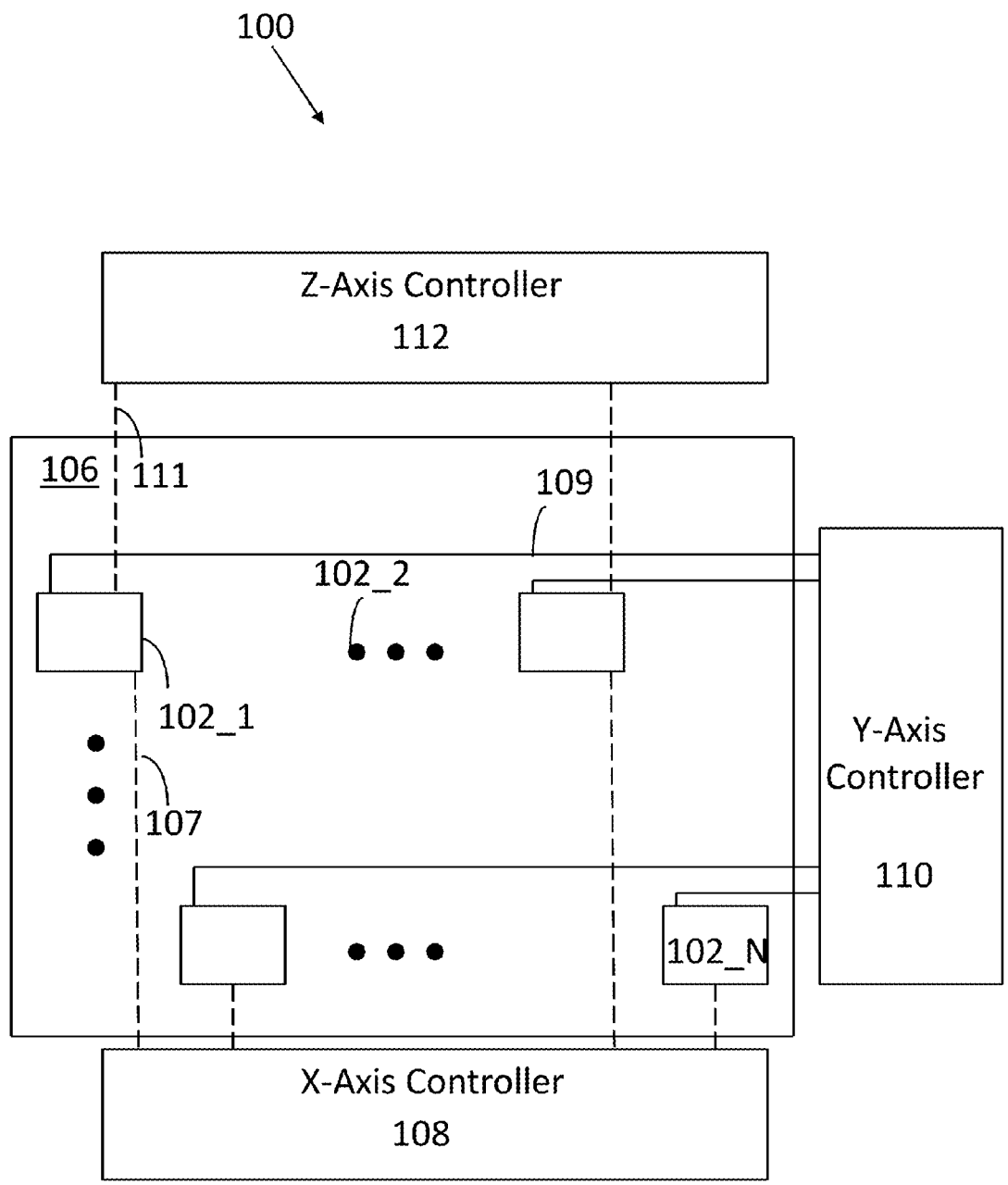
FIG. 1 illustrates a magnetic sensor surface shape analysis system configured in accordance with an embodiment of the invention.

FIG. 1 illustrates a magnetic sensor surface shape and spatial positioning analysis system 100, which is configured in accordance with an embodiment of the invention. The system 100 includes a set of magnetic sensors 102_1 through 102_N positioned on a flexible substrate 106 (e.g., polyimide or similar material). Each magnetic sensor 102 is identical and is sensitive to an external magnetic field along three dimensions of space. In one embodiment, each magnetic sensor has an axis of sensitivity oriented in a direction defined by a predetermined pattern used to cover the surface 106.

Each sensor 102 has a link 107 to an X-axis controller 108, a link 109 to a Y-axis controller 110 and a link 111 to a Z-axis controller 112. The controllers may be positioned on or outside of the flexible substrate 106. The controllers may be combined into a single controller.

Link 107 is shown as a dashed line to suggest that it might be on a different plane of the substrate 106 (i.e., the substrate 106 may have multiple conductive layers). The matrix configuration of FIG. 1 is exemplary. Various uniform and non-uniform spacing paradigms may be used.

Each magnetic sensor 102 must have sufficient sensitivity to measure the magnitude and orientation of the earth's magnetic field, which is substantially uniform in any local area. In one embodiment, MLU sensors of the type described in European Patent Application 2013EP-290244 (CROCUS-63-EP) filed Nov. 10, 2013, and European Patent Application 2013EP-290243 (CROCUS-65-EP) filed Nov. 10, 2013, are used. These applications are owned by the owner of this patent application and are incorporated herein by reference. In one embodiment, an MLU sensor of the type described in U.S. Ser. No. 13/787,585 (the '585 application), filed Mar. 6, 2013, is used. The '585 application is owned by the owner of this patent application and is incorporated herein by reference.

By way of overview, the MLU sensors disclosed in the referenced applications include a magnetic tunnel junction with a reference layer that has a reference magnetization oriented substantially parallel to the plane of the reference layer. A sense layer has a sense magnetization. A tunnel barrier layer is positioned between the sense and reference layers. A magnetic device provides a sense magnetic field adapted for aligning the sense magnetization. The sense layer magnetization may be oriented between a direction parallel to the plane of the sense layer and a direction perpendicular to the plane of the sense layer when the sense magnetic field is provided. The sense layer magnetization may be oriented with a magnitude of an external magnetic field being below 150 Oe.

An external magnetic field has an in-plane component oriented parallel to the plane of the sense layer and an out-of-plane component perpendicular to the plane of the sense layer. The out-of-plane component and the in-plane component are sensed by the sense layer.

Figure 2:
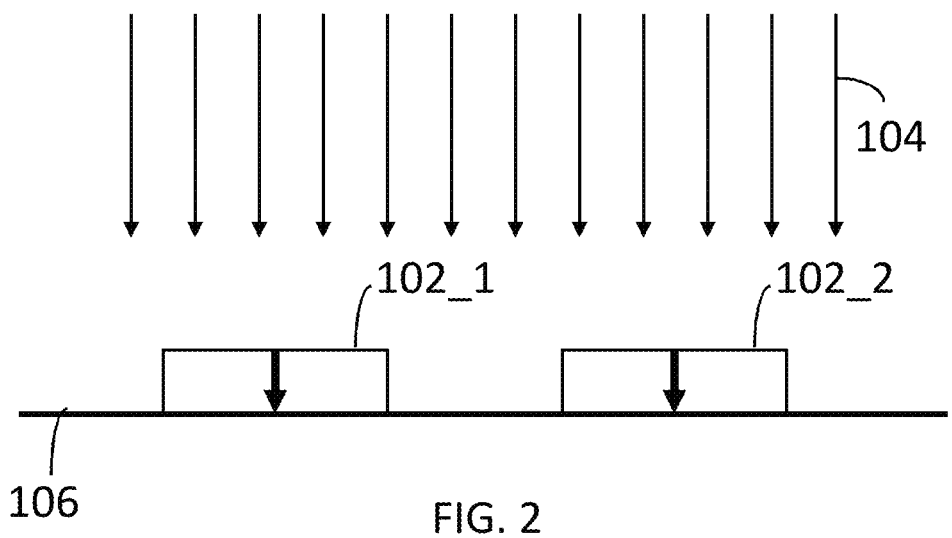
FIG. 2 is a side view of two magnetic sensors in a uniform magnetic field.

FIG. 2 is a side view of two magnetic sensors 102_1 and 102_2 in a uniform magnetic field 104 (e.g., the earth's magnetic field). In this instance, the substrate 106 is flat. The magnetic field 104 is orthogonal to the flat surface. The magnetic sensor 102 is positioned to receive an orthogonal magnetic field and therefore generates a reference output.

Figure 3:
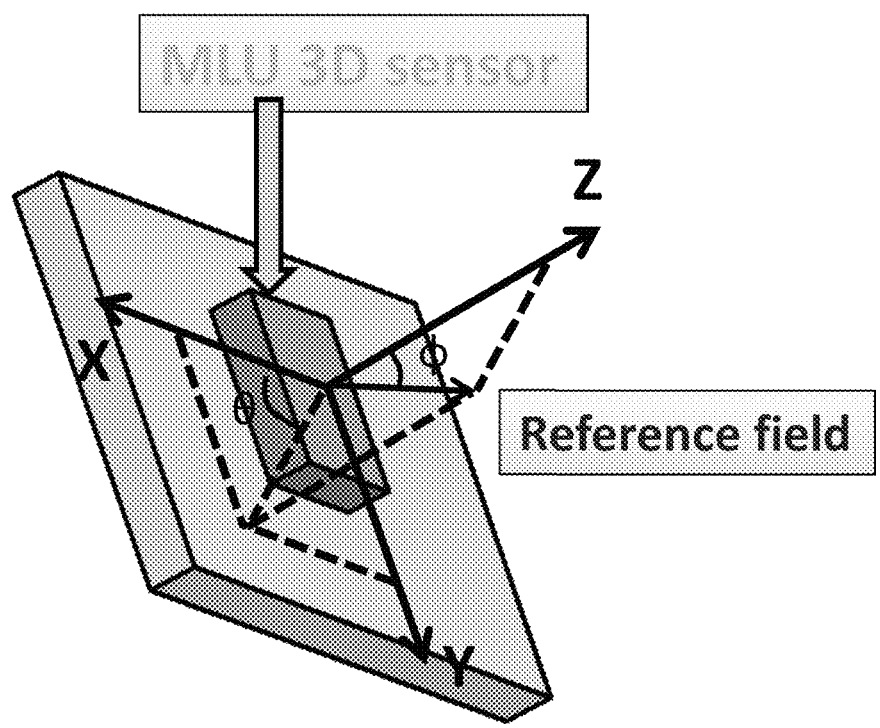
FIG. 3 illustrates magnetic sensor orientation in three axes relative to a uniform magnetic field.

FIG. 3 illustrates magnetic sensor orientation in three axes relative to a uniform magnetic field. The figure also illustrates associated angles for a vector mapped to X, Y and Z values.

Figure 4:
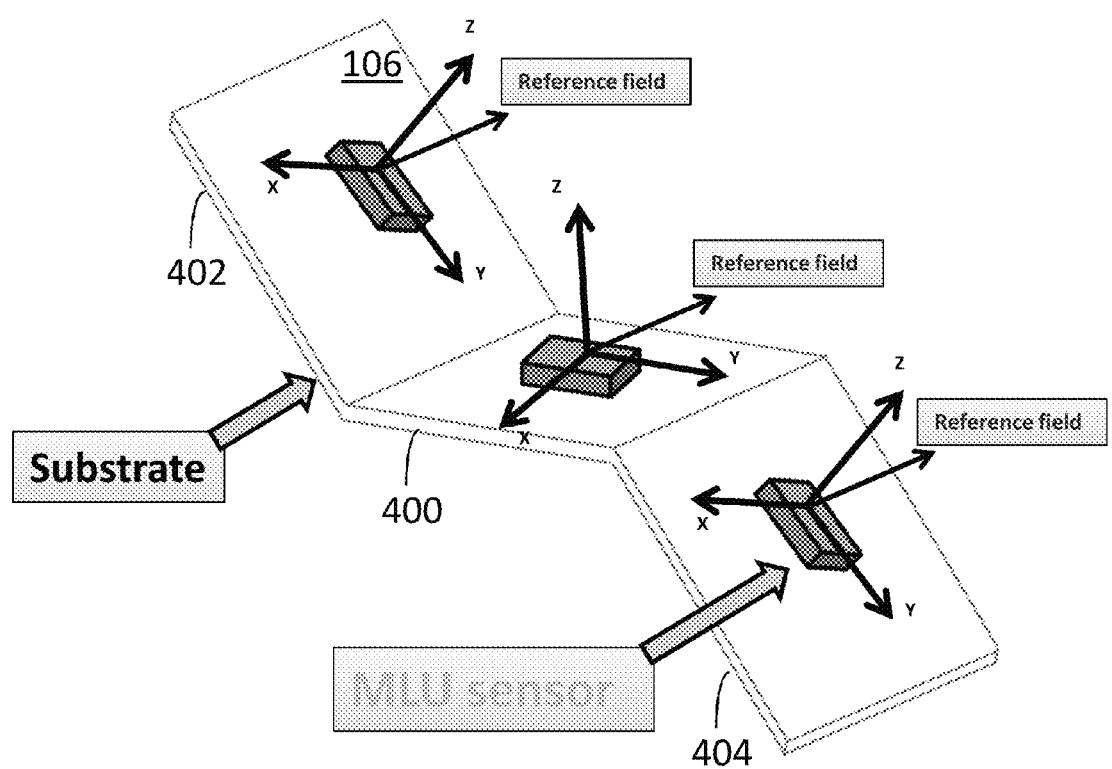
FIG. 4 illustrates a deformed substrate and resultant magnetic sensor vector signals.

FIG. 4 illustrates the surface 106 with a flat section 400, which will receive a signal corresponding to the orientation of the reference field (e.g., earth field). Section 402 is deformed upwards, while section 404 is deformed downwards. As a result, the sensors on sections 402 and 404 detect different signals corresponding to the same reference field. The different signals are indicative of respective orientations of sections 402 and 404.

Thus, it can be appreciated that obtaining information from all sensors distributed over the surface 106 provides precise information on the shape of the surface. The physical position of each sensor is known. Therefore, the position can be correlated with the magnetic sensor signal to develop a shape profile for each position on the surface 106.

Returning to FIG. 1, it can be appreciated that the X-axis controller 108 samples magnetic sensor signals to identify rotation along the Y-axis and Z-axis, while the Y-axis controller 110 samples magnetic sensor signals to identify rotation along the X-axis and Z-axis and the Z-axis controller 112 samples magnetic sensor signals to identify rotation along the X-axis and Y-axis. Various sampling techniques may be used. For example, in a quiescent state a first sampling rate may be used across the entire surface 106. Upon detection of rotation within a region of the surface, the sampling rate may be increased in the subject region. The controllers 108, 110 and 112 may track the rate of change over time. Accordingly, surface profiles and spatial orientation over time may be produced. This can be used for sensing rotation, thereby operating as a gyroscope.

Observe that for any particular sensor, the signal collected allows one to deduce the magnitude of the reference field and the orientation of the sensor with respect to the reference field. Since the reference field is fixed, uniform and identical for all sensors, information from sensors enables one to deduce the relative orientation of any sensor with respect to any other sensor. The earth's magnetic field provides a fixed magnetic field of approximately 0.5 Oersted, which is sufficient for a sensor. However, for certain applications, a stronger externally generated magnetic field (e.g., 200 Oersted) may be utilized for increased sensitivity and accuracy. The externally generated magnetic field may be produced by a proximately positioned magnet. Alternately, the externally generated magnetic field may be produced by lines that carry currents and thereby induce a magnetic field.

An assembly of sensors on a flexible substrate may be used to cover an object or be positioned within the object. Taking known positions on the surface or within the object and relative orientation of sensors to each other enables one to deduce the shape of the object. The knowledge of sensor orientation with respect to the reference field allows one to deduce the orientation of the object itself with respect to the reference field. Since the measurement of position and shape is not dependent on the proximity to a local source of magnetic field, the sensors can be freely arranged at long distances from one another to effectively cover very large objects, such as a bridge or building to monitor movement, position, oscillatory modes and so forth.

Embodiments of the invention can be used for body motion capture with applications in fields as varied as film making (e.g., motion capture) or medical applications (respiratory monitoring). In such cases the sensors may be inserted in a three dimensional body to deliver additional information on the local variations within the object.

Techniques of the invention may be used with other shape and spatial position sensors for increased accuracy and sensitivity. Elastic deformation may be sensed when localized magnets are used to generate magnetic fields on each sensor. When a membrane is stretched, the magnet and sensor separation increases so the detected magnetic field is reduced independently of any bending.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A device, comprising:
   a flexible substrate supporting an array of magnetic sensors exposed to a uniform external magnetic field; and
   one or more controllers to receive magnetic sensor signals from the array of magnetic sensors, wherein the one or more controllers collect reference magnetic sensor signals from the array of magnetic sensors when the flexible substrate is aligned with the uniform external magnetic field, first polarity magnetic sensor signals from the array of magnetic sensors in response to deformation of the flexible substrate in a first direction and second polarity magnetic sensor signals from the array of magnetic sensors in response to deformation of the flexible substrate in a second direction, such that the magnetic sensor signals establish a profile of the orientation of the flexible substrate with respect to the uniform external magnetic field;
   wherein the one or more controllers utilize a first sampling rate in the array of magnetic sensors until detection of deformation of the flexible substrate in a region of the array of magnetic sensors and a second sampling rate in the array of magnetic sensors greater than the first sampling rate in the region of the array of magnetic sensors in response to the detection.

2. The device of claim 1 wherein the uniform external magnetic field is magnetic earth.

3. The device of claim 1 wherein the uniform external magnetic field is an applied magnetic field.

4. The device of claim 3 wherein the applied magnetic field is generated by a magnet.

5. The device of claim 3 wherein the applied magnetic field is generated by a current in a conductor.

* * * * *